United States Patent [19]

Liu

[11] Patent Number: 5,550,085

[45] Date of Patent: Aug. 27, 1996

[54] METHOD FOR MAKING A BURIED CONTACT

[75] Inventor: Min-Sea Liu, Chung-Li, Taiwan

[73] Assignee: Winbond Electronics Corp., Hsinchu, Taiwan

[21] Appl. No.: 525,817

[22] Filed: Sep. 7, 1995

[51] Int. Cl.⁶ .................................................. H01L 21/44
[52] U.S. Cl. ........................ 437/203; 437/192; 437/193; 437/245
[58] Field of Search .................................. 437/203, 192, 437/193, 246, 245, 233; 156/655.1, 656.1

[56] References Cited

U.S. PATENT DOCUMENTS

| | | | |
|---|---|---|---|
| 4,214,946 | 7/1980 | Forget et al. | 156/643 |
| 5,007,982 | 4/1991 | Tsou | 156/643 |
| 5,160,407 | 11/1992 | Latchford et al. | 156/656 |
| 5,162,259 | 11/1992 | Kolar et al. | 437/192 |
| 5,292,676 | 3/1994 | Manning | 437/46 |
| 5,336,365 | 8/1994 | Goda et al. | 156/643 |
| 5,338,398 | 8/1994 | Szwejkowski | 156/655 |
| 5,410,174 | 4/1995 | Kalnitsky | 257/384 |
| 5,427,980 | 6/1995 | Kim | 437/190 |

*Primary Examiner*—George Fourson
*Assistant Examiner*—C. Everhart
*Attorney, Agent, or Firm*—Barnes, Kisselle, Raisch, Choate, Whittemore & Hulbert P.C.

[57] ABSTRACT

A method of forming damage-free buried contacts in a semiconductor substrate without the trenches and pitted areas can be carried out by forming a silicon oxide layer as a gate dielectric layer on top of the substrate, forming a first polysilicon layer on top of the silicon oxide layer, anisotropically etching away the first polysilicon layer by using a first mask and a first etching gas that has high etching selectivity between polysilicon and silicon oxide such that a first portion of the polysilicon layer is left on the top surface of the substrate except the area defining a buried contact, forming in the substrate a zone of a second conductivity type at the area defining the buried contact by implanting impurity ions, removing the silicon oxide layer over the area defining the buried contact and removing the masking layer over the first portion of the polysilicon layer, depositing sequentially a conducting layer and a second polysilicon layer, anisotropically etching the second polysilicon layer over an area defining a transistor gate electrode and interconnect by using a second mask and a second etching gas that has high etching selectivity between polysilicon and the conducting layer, anisotropically etching the conducting layer over the area defining the transistor gate electrode and interconnect by a third etching gas that has high etching selectivity between the conducting layer, the polysilicon layer and the silicon layer, and optionally removing the residual polysilicon in the transistor gate electrode and interconnect by heating to a temperature of not less than 800° C. in an $O_2$ or $H_2O$ ambient.

21 Claims, 4 Drawing Sheets

METHOD FOR MAKING A BURIED CONTACT

FIELD OF THE INVENTION

The present invention generally relates to a method for fabricating a semiconductor device and more particularly, relates to a method for forming a damage-free buried contact in a semiconductor device.

BACKGROUND OF THE INVENTION

A buried contact is an electrical contact that connects polysilicon layer to a doped region in a semiconductor substrate. Buried contacts have been widely used in CMOS SRAM circuit. A CMOS SRAM cell contains two load resistors, two pull down transistors and two pass transistors. One of the pull down transistors utilizes buried contact to connect gate electrode to the drain of the other pull down transistor. In a typical CMOS SRAM cell layout, the drains of the pull down transistors also serve as the drains of the pass transistors that provide access from the bit lines to the memory cells.

A typical process for the formation of a buried contact by a prior art method is shown in FIGS. 1a through 1e. Shown in FIG. 1a, is a P– type semiconductor substrate 12 that has undergone some of the processing steps in the fabrication of a semiconductor device. A thin oxide layer 14 is formed onto the surface of substrate 12 and functions as a gate dielectric layer. A thin polysilicon layer 16 is immediately deposited after the thin oxide layer 14 is formed. The thin polysilicon layer 16 and the thin oxide layer 14 are patterned using photo resist mask 18 (FIG. 1b) and etched to form a buried contact 20 (FIG. 1c). Photo resist mask is then removed and a thick polysilicon layer 24 is deposited on the thin polysilicon layer 16 and the buried contact region 20. Subsequentlys the substrate 12 is doped with phosphorous oxychloride ($POCl_3$) to reduce the resistance of the polysilicon layers 16 and 24, and to form an N+ region 22 in the substrate 12 as shown in FIG. 1d. The polysilicon layers 16 and 24 are patterned by a photo resistor mask and etched by an anisotropic etch process to form a transistor gate electrode 27 and interconnect 26. This is shown in FIG. 1e. The anisotropic etch process also etches the silicon substrate 12 at about the same etch rate, since both the polysilicon and the silicon substrate contain silicon. A trench 30 is formed during the etching process used to form the gate electrode 27 and the interconnect 26. The formation of trench 30 is undesirable because it provides a leakage path between the N+ region 22 and the substrate 12.

It is therefore an object of the present invention to provide a method of forming buried contacts in a semiconductor substrate that does not have the drawbacks and the shortcomings of the prior art methods.

It is another object of the present invention to provide a method of forming damage-free buried contacts in a semiconductor substrate.

It is a further object of the present invention to provide a method of forming buried contacts in a semiconductor substrate that does not produce defects such as trenches or pitted areas.

It is still another object of the present invention to provide a method of forming buried contacts in a semiconductor substrate that does not produce trenches and the subsequent leakage paths between the N+ region and the P– type silicon substrate.

It is another further object of the present invention to provide a method of forming buried contacts in a semiconductor substrate that utilizes etching gases having high etching selectivity between different materials in the substrate.

It is yet another object of the present invention to provide a method of forming buried contacts in a semiconductor substrate that utilizes etching gases that have high etching selectivity between different materials of polysilicon, silicon oxide and single crystalline silicon.

SUMMARY OF THE INVENTION

In accordance with the present invention, a method of forming buried contacts in a semiconductor substrate that are damaged-free and without the trenches and pitted areas is provided.

In a preferred embodiment, a method of forming buried contacts in a semiconductor substrate of a first conductivity type can be carried out by forming a silicon oxide layer as a gate dielectric layer on top of the substrate, forming a first polysilicon layer on top of the silicon oxide layer, anisotropically etching away the first polysilicon layer by using a first mask and a first etching gas that has high etching selectivity between polysilicon and silicon oxide such that a first portion of the polysilicon layer is left on the top surface of the substrate except the area defining a buried contact, forming in the substrate a zone of a second conductivity type at the area defining the buried contact by implanting impurity ions, removing the silicon oxide layer over the area defining the buried contact and removing the masking layer over the first portion of the polysilicon layer, depositing sequentially a conducting layer and a second polysilicon layer, anisotropically etching the second polysilicon layer over an area defining a transistor gate electrode and interconnect by using a second mask and a second etching gas that has high etching selectivity between polysilicon and the conducting layer, anisotropically etching the conducting layer over the area defining the transistor gate electrode and interconnect by a third etching gas that has high etching selectivity between the conducting layer, polysilicon and silicon, and optionally removing the residual polysilicon in the transistor gate electrode and interconnect by heating to a temperature of not less than 800° C. in an $O_2$ or $H_2O$ ambient.

In an alternate embodiment, the silicon oxide layer over the area defining the buried contact can be first removed prior to the step of implanting impurity ions into the substrate at the area defining a buried contact in order to form a zone of a second conductivity type. For implanting N+ type ions without the silicon oxide layer, either phosphorus or arsenic ions can be used.

The present invention is further directed to buried contacts fabricated according to the method provided by the present invention wherein etching gases having high etching selectivity are used such that only the polysilicon layer and the conducting layer are etched away while the silicon substrate is not damaged.

BRIEF DESCRIPTION OF THE DRAWINGS

Other objects, features and advantages of the present invention will become apparent upon consideration of the specification and the appended drawings, in which.

It should be noted that for illustration purpose, the elements shown in the figures are not necessarily drawn to scale. The dimensions of the elements are sometimes exaggerated relative to each other for clarity purpose.

DETAILED DESCRIPTION OF THE PREFERRED EMBODIMENT

The present invention discloses a new method of forming buried contacts in semiconductor substrates that is capable of producing buried contacts without defects such as trenches or pitted areas on the silicon substrate.

Figure 1A:
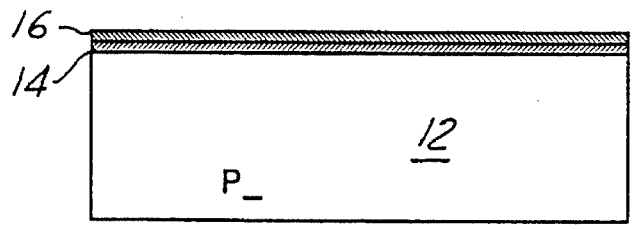
FIGS. 1a–1e are enlarged, cross-sectional views showing a prior art method of forming a buried contact.
Figure 1B:
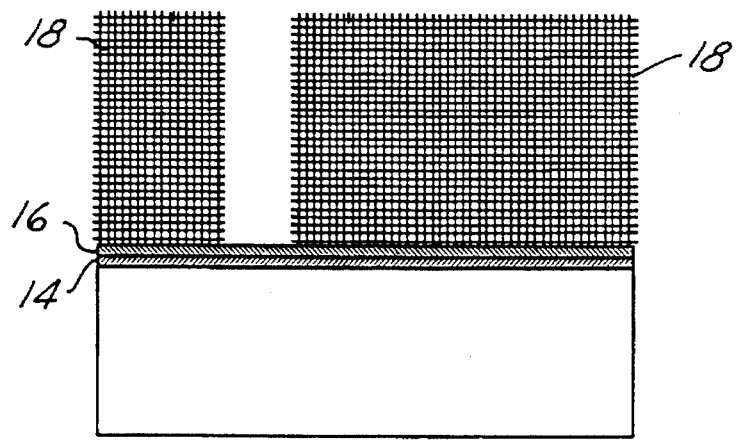
Figure 1C:
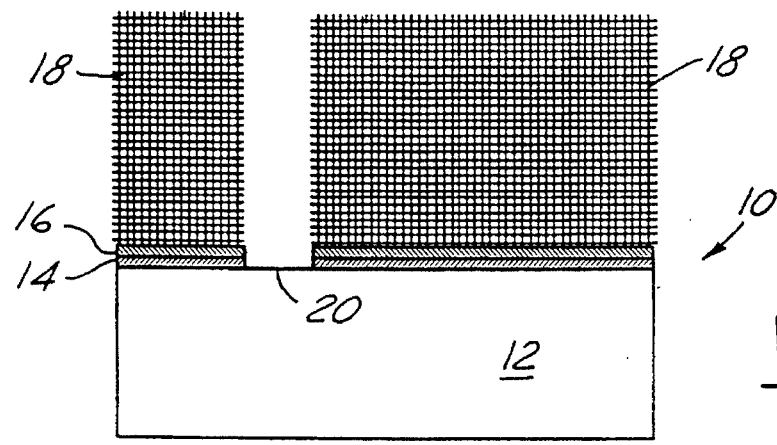
Figure 1D:
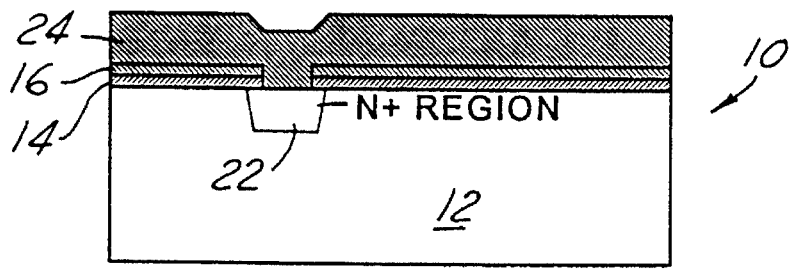
Figure 1E:
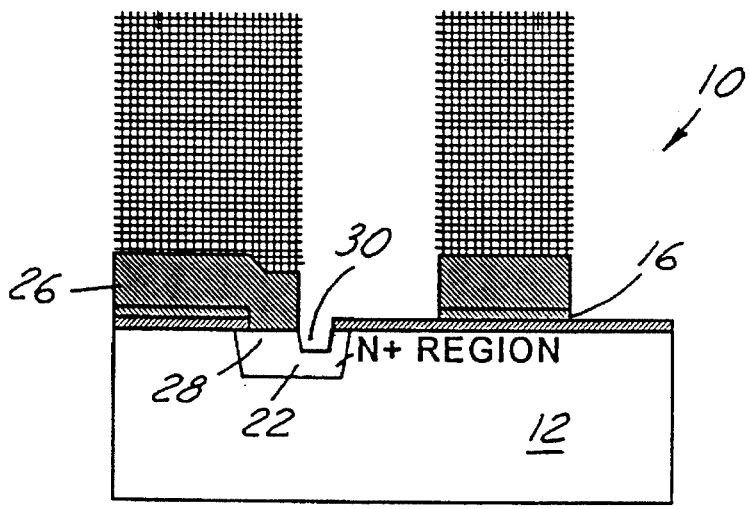
Figure 2:
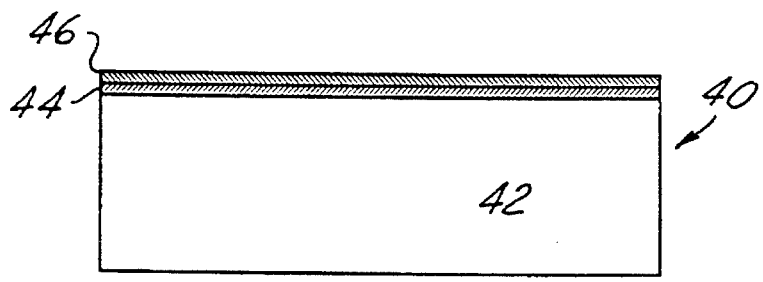
FIGS. 2–9 are enlarged, cross-sectional views of the present invention process of forming a buried contact.

Referring initially to FIG. 2, where it is shown an enlarged cross-sectional view of semiconductor device 40 having a silicon substrate 42. The silicon substrate 42 shown is of P– type substrate. However, silicon substrate 42 can be doped with impurity ions such as phosphorus, arsenic or boron to impart an N– or P– type electrical conductivity to the substrate. To form an N– channel device, for instance, substrate 42 is preferably single crystal silicon doped with boron to impart a P– type conductivity.

A gate dielectric layer 44 of silicon oxide material is first formed on the silicon substrate 42. The oxide layer can be formed either by a thermal oxidation process or by a chemical vapor deposition process to a thickness of approximately between 5~20 nm. A thin polysilicon layer 46 is then deposited on top of the silicon oxide layer by a chemical vapor deposition technique to a thickness of approximately between 5~100 nm. The polysilicon layer 46 serves to protect the gate dielectric layer from outside contamination. It is frequently deposited at a temperature range between 600~700° C.

Figure 3:
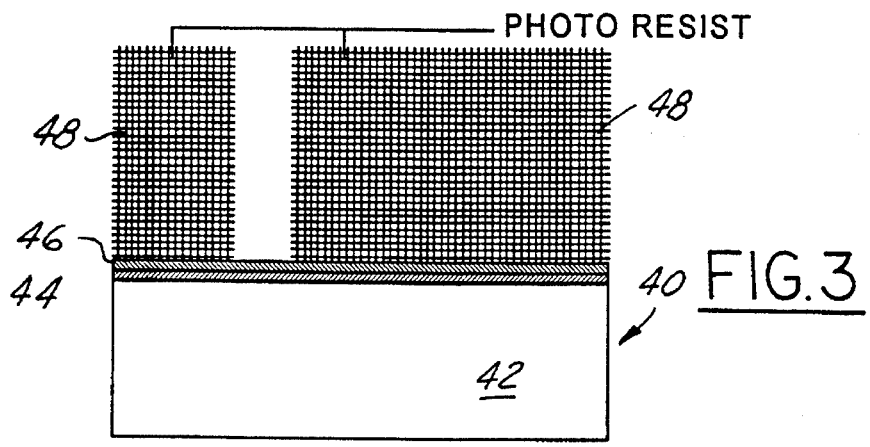
Figure 4:
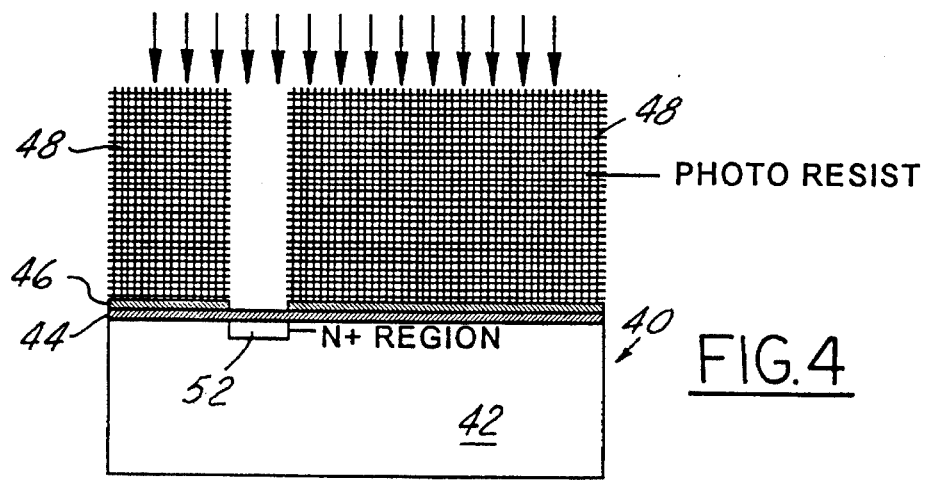

A photo resist layer 48, as shown in FIG. 3, having a thickness between approximately 500~2000 nm is then deposited to define a pattern of the buried contacts. In the next processing step, the polysilicon layer on top of the buried contact region is anisotropically etched away by a plasma etching process. This step is shown in FIG. 4. It is noted that only the polysilicon layer 46 is etched away by utilizing etching gases that have high etching selectivity between polysilicon and silicon oxide, i.e., the etching gas has a high etch rate for polysilicon and a low etch rate for silicon oxide. The etching gas can be selected from any one of the following gas mixtures, $SiCl_3/Cl_2$, $BCl_3/Cl_2$, HBr/$Cl_2$/$O_2$, HBr/$O_2$, Br/$SF_6$ and $SF_6/O_2$. We have also used other suitable etching gases that work equally well.

Figure 5:
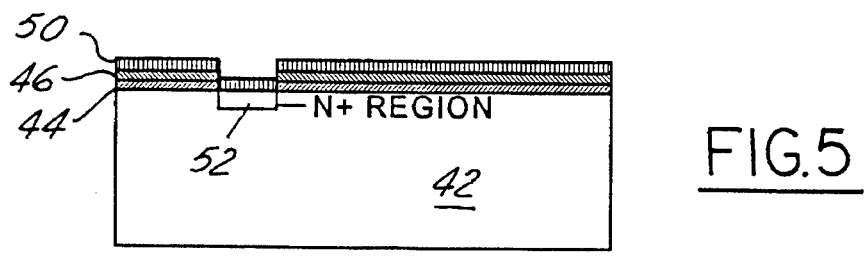

In the next step of the process, N– type ions are implanted into the buried contact region in the silicon substrate to form an N+ region. The impurity ions implanted can be either phosphorus or arsenic. When phosphorus ions are implanted, an implantation energy of between approximately 10~80 kev and a dosage of 1E15~8E15/cm² are used. When impurity ions of arsenic are implanted, an implantation energy of between approximately 10~100 kev and a dosage of approximately 1E15~7E15/cm² are used. After the ion implantation process, the substrate is frequently annealed at a temperature higher than 800° C. However, the annealing process can also be performed at a later stage. In the next stage of the process, as shown in FIG. 5, the silicon oxide layer over the buried contacts is removed by either a wet etch or a dry etch method. Some of the etching gases utilized are $CCl_2F_2$, $CHF_3/CF_4$, $CHF_3/O_2$ and $CH_3CHF_2$. Other etchant such as an HF-based solution or an HF-based solution plus buffering agents, such as $NH_4F$, may also be used in the etching process.

It should be noted that the ion implantation step described above can also be performed after the silicon oxide layer over the buried contacts is first removed. This would obviously save the oxide removal step after the implantation process. When the ion implantation process is performed after the oxide removal process, phosphorus ions can be implanted at an energy level of 5~70 kev and a dosage level of 1E15~8E15/cm² while arsenic ions can be implanted at an energy level of 5~80 kev and a dosage level of 1E15~7E15/cm².

After the removal of the oxide layer, the photo resist layer is subsequently removed. Throughout the reduction to practice of the present invention, various methods have been used to remove photo resist layers. For instance, organic strippers such as phenol-based strippers of J-100 by Indus-R-Chem or A20 by Allied Chemical and phenol-free organic strippers such as Burmar 712 by EKC Chemical, Ecostrip by Allied Chemical or Remover 1112A by Shipley have been used. Oxidizing-type strippers such as $H_2SO_4/H_2O_2$ have been used at a temperature of 100~150° C. Dry stripping techniques such as oxygen plasma have also been used to remove photo resist layers.

Figure 6:
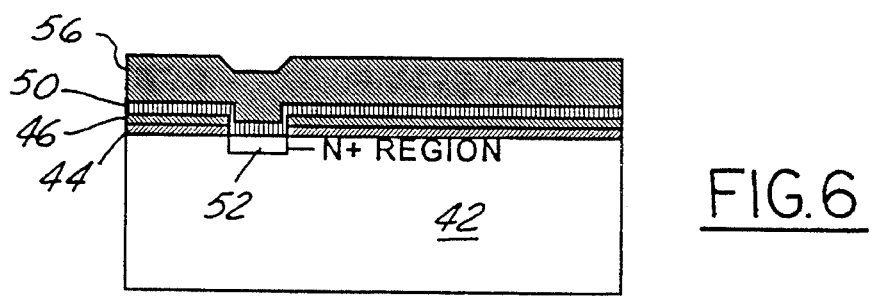

A conducting layer of either TiN or TiW material is then deposited by a chemical vapor deposition technique to a thickness of approximately between 10~200 nm. A sputtering deposition technique can also be used to deposit the conducting layer 50. As shown in FIG. 6, on top of the conducting layer 50, a layer 56 of polysilicon having a thickness of between approximately 100~500 nm is deposited. The polysilicon layer 56 can be deposited at a temperature of 600~700° C. by a chemical vapor deposition technique. The polysilicon layer 56 is then doped to reduce its resistivity by a diffusion process conducted in a furnace at approximately 800~1000° C. in the presence of $POCl_3$ gas as the source of P. The conducting layer 50 under the polysilicon layer 56 acts as a diffusion barrier such that P ions cannot diffuse into the silicon substrate 42. The resistivity of the polysilicon is reduced from 500~2000 $G\Omega/\square$ before the diffusion process to a value of approximately 20~100$\Omega$/square after the diffusion process.

Figure 7:
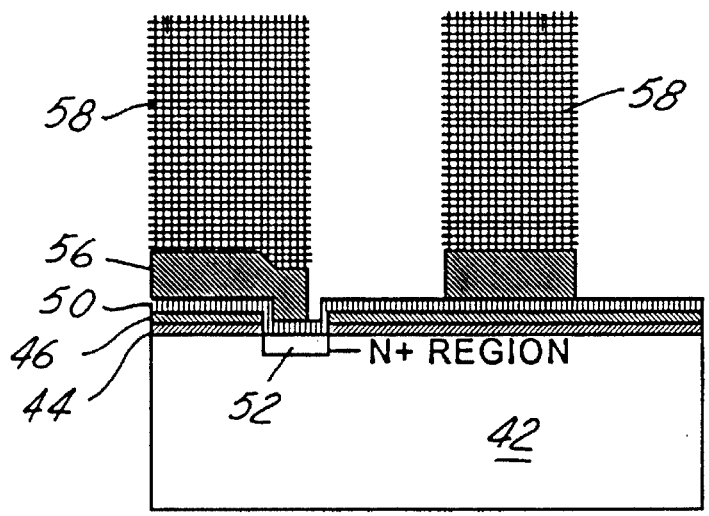

In the next processing step, as shown in FIG. 7, a photo resist layer 58 is deposited to define a pattern of the transistor gate electrode and interconnect in the silicon substrate. An isotropic etching process is then used to etch away the polysilicon layer 56 on top of the transistor gate electrode and interconnect by using the conducting layer 50 as an etch-stop to prevent damage to the Si substrate. The etching gas used is similar to the previous etching step for the polysilicon layer. An anisotropic etch is usually carried out in a reactive-ion-etch (RIE) reactor utilizing a combination of etch gases and reactor conditions, which results in more rapid etching of a material in the vertical direction than in the horizontal direction. This leads to the formation of a desirable structure having substantially vertical walls. In addition, the etching gas chosen should have a high etch rate on the polysilicon layer and a low etch rate on the underlying layer, i.e. the conducting layer. In other words, there is a desirable etching selectivity between the polysilicon layer and the conducting layer such that the conducting layer acts as a suitable etch-stop for the etching of the polysilicon layer.

Figure 8:
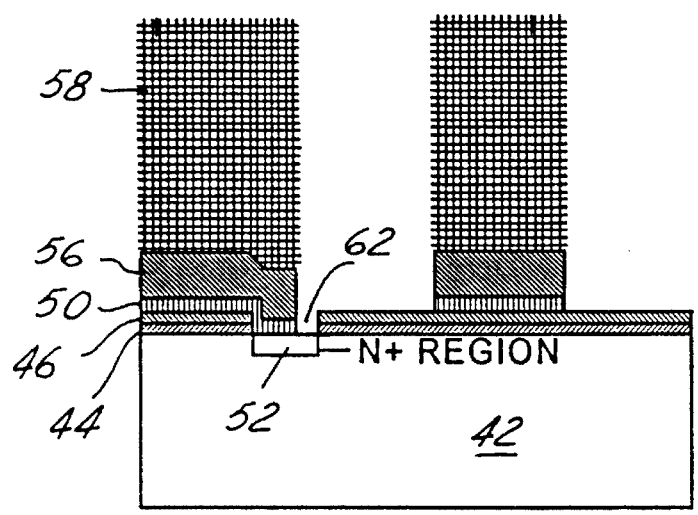

A plasma etching process is then used to anisotropically etch away the conducting layer 50 in the transistor gate electrode and interconnect 62. This is shown in FIG. 8. When the conducting layer is of TiN material, the etching gas used is $Cl_2$/Ar. When the conducting layer is of TiW material, the etching gas used is $SF_6$/Ar or $SF_6/N_2$. The etching gas formulation must have desirable high etching selectivity between the conducting layer, the silicon layer and the polysilicon layer. In other words, the etching gas formulation must have a high etch rate on the conducting layer and a low etch rate on the silicon and the polysilicon layer. With the desirable etching selectivity, the silicon substrate 42 will not be damaged during the etching of the conducting layer 50 at the transistor gate electrode and interconnect 62. However, sometimes it is inevitable to have residual polysilicon left in the transistor gate electrode and interconnect 62.

Figure 9:
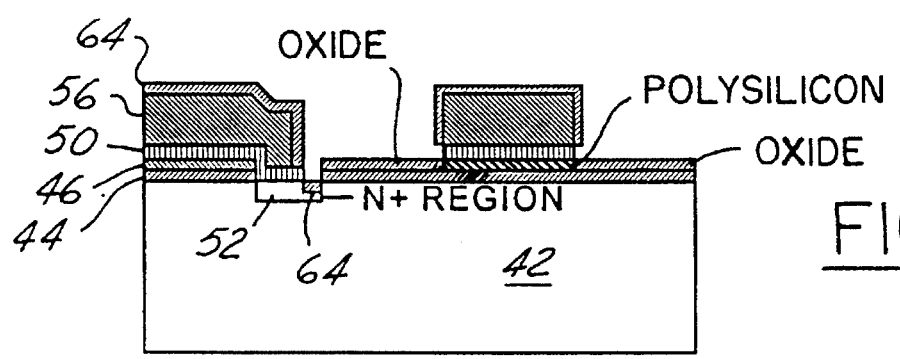

In order to remove the residual polysilicon in the transistor gate electrode and interconnect 62 and not damaging the silicon substrate 42, the use of an oxidation method is preferred. After the photo resist layer 58 is removed by one of the previously described methods, a high temperature oxidation process carried out in a furnace at between 800~1150° C. in an $O_2$ or $H_2O$ atmosphere effectively oxidize the residual polysilicon and the exposed silicon substrate 42 into silicon oxide 64. The time required for such oxidation process is frequently more than ten minutes. This is shown in FIG. 9. No damage to the silicon substrate 42 has occurred by using the present invention novel method.

It should be noted that while in the preferred embodiment the wafer used is a P− type substrate, the present invention method can be equally applied to an N− type substrate. In an N− type substrate, the buried contact should be fabricated in a P− well.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention. For instance, polysilicon has been shown as the desired material for making contact in a semiconductor substrate. However, any other materials that have similar conformal, electrical and dopant-migrating characteristics may also be suitably used in the present invention method.

The embodiments of the invention in which an exclusive property or privilege is claimed are defined as follows:

1. A method of forming a buried contact in a semiconductor silicon substrate of a first conductivity type having a top surface comprising the steps of:

forming a silicon oxide layer on said top surface of the substrate, forming a first polysilicon layer over said silicon oxide layer, etching said first polysilicon layer by using a first mask and a first etching gas having etching selectivity between polysilicon and silicon oxide such that a first portion of said polysilicon layer is left on the top surface of said substrate except the area defining said buried contact, forming in said substrate a zone of a second conductivity type at the area defining the buried contact by implanting impurity ions, removing the silicon oxide layer over said area defining said buried contact and removing the first mask over said first portion of said polysilicon layer, blanket depositing sequentially a conducting layer and a second polysilicon layer, etching said second polysilicon layer over an area defining a transistor gate electrode and interconnect by using a second mask and a second etching gas having high etching selectivity between polysilicon and the conducting layer, using the conducting layer as an etch stop, and etching said conducting layer over said area defining said transistor gate electrode and interconnect by a third etching gas having etching selectivity between 1) the conducting layer, and 2) polysilicon and silicon.

2. A method according to claim 1, wherein said first conductivity type is P− type.

3. A method according to claim 1, wherein said second conductivity type is N− type.

4. A method according to claim 1, wherein said silicon oxide layer on said top surface of the substrate is formed by thermal oxidation or by chemical vapor deposition.

5. A method according to claim 1, wherein said silicon oxide layer formed on said top surface of the substrate is a gate dielectric layer.

6. A method according to claim 1, wherein said first polysilicon layer is formed by chemical vapor deposition.

7. A method according to claim 1, wherein said first polysilicon layer has a thickness of between about 10 to about 70 nm.

8. A method according to claim 1, wherein said first etching gas is selected from the group consisting of $SiCl_3/Cl_2$, $BCl_3/Cl_2$, $HBr/Cl_2/O_2$, $HBr/O_2$, $Br_2/SF_6$, and $SF_6/O_2$.

9. A method according to claim 1, wherein said impurity ions implanted are P ions or As ions.

10. A method according to claim 1, wherein said impurity ions implanted are P ions at an energy level between about 10 and about 80 Kev and a dosage level between about 1E15 and about 8E15/$cm^2$.

11. A method according to claim 1, wherein said impurity ions implanted are As ions at an energy level between about 10 and about 100 Kev and a dosage level between about 1E15 and about 7E15/$cm^2$.

12. A method according to claim 1 further comprising the step of annealing said substrate at a temperature higher than about 800° C. after said ion implantation step.

13. A method according to claim 1, wherein said conducting layer by TiN or TiW.

14. A method according to claim 1, wherein said conducting layer has a thickness between about 10 and about 100 nm.

15. A method according to claim 1, wherein said conducting layer is formed by either sputtering or chemical vapor deposition.

16. A method according to claim 1, wherein said second polysilicon layer is deposited to a thickness between about 150 and about 400 nm by a chemical vapor deposition process.

17. A method according to claim 1 further comprising the step of doping said second polysilicon layer with a phosphorus containing gas.

18. A method according to claim 1, wherein said second etching gas is selected from the group consisting of $SiCl_3/Cl_2$, $BCl_3/Cl_2$, $HBr/Cl_2/O_2$, $HBr/O_2$, $Br_2/SF_6$, and $SF_6/O_2$.

19. A method according to claim 1, wherein said third etching gas is $Cl_2/Ar$ or $SF_6/Ar$.

20. A method according to claim 1 further comprising the step of removing residual polysilicon in the transistor gate electrode and interconnect by a process including heating to a temperature of not less than 800° C.

21. A method of forming a buried contact in a semiconductor substrate of a first conductivity type having a top surface comprising the steps of:

forming a gate dielectric layer of silicon oxide on said top surface of the substrate, forming a first polysilicon layer over said silicon oxide layer, anisotropically etching said first polysilicon layer by using a first mask and a first etching gas having an etch rate for polysilicon and an etch rate for silicon oxide lower than the itch rate for polysilicon such that a first portion of said polysilicon layer is left on the top surface of said substrate except the area defining said buried contact, forming in said substrate a zone of a second conductivity type at the area defining the buried contact by implanting impurity ions, removing the silicon oxide layer over said area defining said buried contact, removing the first mask over said first portion of said polysilicon layer, depositing sequentially a conducting layer and a second polysilicon layer, anisotropically etching said second polysilicon layer over an area defining a transistor gate electrode and interconnect by using a second mask and a second etching gas having an etch rate for polysilicon and low etch rate for the conducting layer, anisotropically etching said conducting layer over said area defining said transistor gate electrode and interconnect by a third etching gas having an etch rate for said conducting layer and an etch rate for said polysilicon and silicon lower than the etch rate for said conducting layer, and removing residual polysilicon in the transistor gate electrode and interconnect by a process including heating to a temperature of not less than 800° C.

* * * * *